United States Patent [19]

Glass

[11] Patent Number: 5,192,916
[45] Date of Patent: Mar. 9, 1993

[54] CHARGE-PUMP PHASE LOCKED LOOP CIRCUIT

[75] Inventor: Kevin W. Glass, San Jose, Calif.

[73] Assignee: MOS Electronics Corporation, Sunnyvale, Calif.

[21] Appl. No.: 763,087

[22] Filed: Sep. 20, 1991

[51] Int. Cl.$^5$ .................... H04K 5/13; G05F 5/00
[52] U.S. Cl. .................... 328/155; 307/510
[58] Field of Search ............ 307/510, 262; 328/155, 328/72, 63; 331/1 A, DIG. 2

[56] References Cited

U.S. PATENT DOCUMENTS 4,222,013  9/1980  Bowers et al. ............ 331/1 A
4,484,295  11/1984  Bedard et al. ............ 330/282

OTHER PUBLICATIONS

James Miller et al., "High Performance Circuits for the 1486 TM Processor", 1989 IEEE, pp. 188–192.

Mark G. Johnson et al., "A Variable Delay Line PLL for CPU-Coprocessor Synchronization", IEEE Journal of Solid-State Circuits, vol. 23, No. 5, Oct. 1988, pp. 1218–1223.

Mark G. Johnson et al., "A Variable Delay Line Phase Locked Loop for CPU-Coprocessor Synchronization", 1988 IEEE International Solid-State Circuits Conference, Feb. 1988, pp. 142–143, 334–335.

Deog-Kyoon Jeong, et al., "Design of PLL-Based Clock Generation Circuits", IEEE Journal of Solid-State Circuits, vol. SC-22, No. 2, Apr. 1987, pp. 255–261.

Rob Woudsma et al., "The Modular Design of Clock-Generator Circuits in a CMOS Building-Block System", IEEE Journal of Solid-State Circuits, vol. SC-20, No. 3, Jun. 1985, pp. 770–774.

Floyd M. Gardner, "Phase Accuracy of Charge Pump PLL's", IEEE Transactions on Communications, vol. COM-30, No. 10, Oct. 1982; pp. 2362–2363.

Floyd M. Gardner, "Charge-Pump Phase-Lock Loops", IEEE Transactions on Communications, vol. COM-28, No. 11, Nov. 1980, pp. 1849–1858.

*Primary Examiner*—William L. Sikes
*Assistant Examiner*—Sinh Tran
*Attorney, Agent, or Firm*—Skjerven, Morrill, MacPherson, Franklin & Friel

[57] ABSTRACT

A charge-pump phase locked loop circuit is disclosed that is capable of operating with a high bandwidth while having a low associated noise jitter characteristic. In addition, the phase locked loop circuit has a high dynamic range and prevents against false locking to sub-harmonic frequencies. Furthermore, common mode noise rejection and other internal noise rejection characteristics are optimized.

8 Claims, 14 Drawing Sheets

FIG. 1A

KEY TO FIG. 1

| FIG. 1A | FIG. 1B |

CHARGE-PUMP PHASE LOCKED LOOP CIRCUIT

BACKGROUND OF THE INVENTION

1. Field of the Invention

This invention relates to phase-locked loop circuits and more particularly to charge-pump phase locked loop circuits.

2. Description of the Relevant Art

As semiconductor processing technology advances, chip performance improves in two ways. One improvement is the number of functional elements integrated onto a single die, and the other is the speed of operation of the circuits. When the speed of operation is increased to enhance the computational power of a chip, accurate clock generation must typically be provided to accommodate synchronous communication protocol. Phase locked loop circuits are a common source for such clock signal generation.

Charge-pump phase locked loop circuits are known for extremely accurate phase tracking capability. During operation, an edge of an internal clock within the charge-pump phase locked loop is accurately aligned to an edge of an external clock by directly comparing the two phases with a sequential phase-frequency detector. Depending upon the phase difference, a capacitive element within the phase locked loop is either charged or discharged. The voltage level across this capacitive element is thereby used to control the phase of the internal clock.

However, there are several problems associated with charge-pump phase locked loop circuits. The first problem relates to an interrelationship between bandwidth and noise jitter (phase jitter). In general, both a high bandwidth and a low noise jitter are desirable. A high bandwidth usually assures a fast locking time characteristic, While low noise jitter assures extremely accurate phase alignment after locking to an input signal frequency. In the design of a typical charge pump phase locked loop circuit, when the bandwidth is increased, an undesirable increase in noise jitter also results. Therefore, a designer must consider the trade-offs between high bandwidth and low noise jitter when designing a phase locked loop circuit for a particular application.

There are several other problems associated with charge-pump phase locked loop circuits. To avoid the possibility of false locking to a sub-harmonic frequency, a phase locked loop circuit is typically designed with a relatively small dynamic range. Thus, the range of frequencies to which the phase locked loop can lock is limited. Other problems within phase locked loop circuits can occur as a result of poor common mode noise rejection, power supply noise rejection and other types of internal noise rejection.

SUMMARY OF THE INVENTION

A charge-pump phase locked loop circuit in accordance with the present invention is capable of operating with a high bandwidth while having a low associated noise jitter characteristic. In addition, the phase locked loop circuit has a high dynamic range and prevents against false locking to sub-harmonic frequencies. Furthermore, common mode noise rejection and other internal noise rejection characteristics are optimized.

In accordance with the invention, a phase locked loop circuit comprises a first latch circuit, a second latch circuit coupled to the first latch circuit, and a first delay circuit coupled to the output of the first latch circuit. The phase locked loop circuit further includes a second delay circuit coupled to the output of the second latch circuit, a phase comparator coupled to the output of the first latch circuit and to the output of the second latch circuit, and an operational amplifier circuit coupled to the output of the phase comparator.

The invention will be more readily understood by reference to the drawings and the detailed description. As will be appreciated by one skilled in the art, the invention is applicable to phase-locked loop circuits in general, and is not limited to the specific embodiment disclosed.

BRIEF DESCRIPTION OF THE DRAWINGS

FIG. 1 A/B is a block diagram of a charge-pump phase locked loop circuit in accordance with the present invention.

DETAILED DESCRIPTION

The following includes a detailed description of the best presently contemplated mode for carrying out the invention. The description is intended to be merely illustrative of the invention and should not be taken in a limiting sense.

Figure 1A:
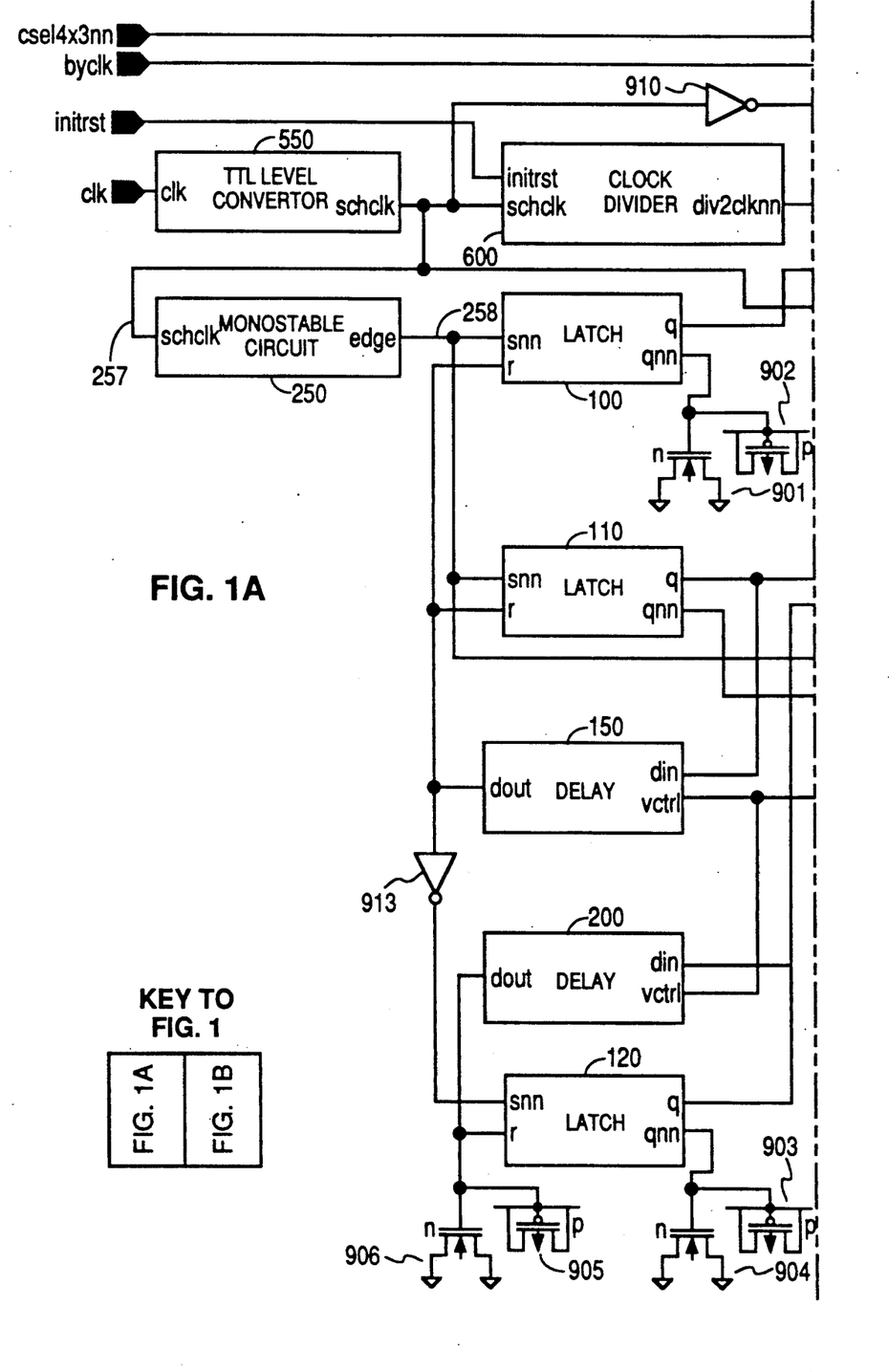
Figure 1B:
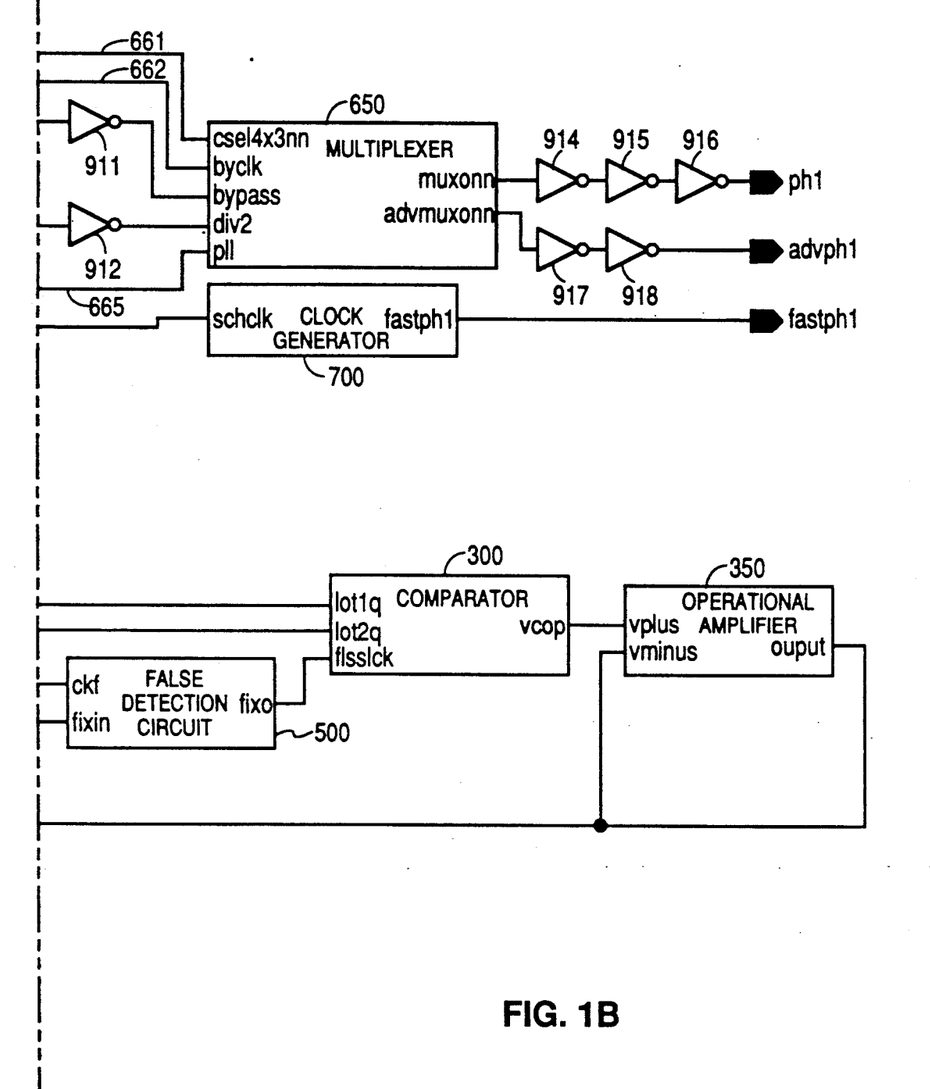

A first embodiment of a phase locked loop circuit in accordance with the present invention is described in conjunction with FIGS. 1-13. Referring first to FIG. 1, a block diagram of the charge-pump phase locked loop circuit is shown. The phase locked loop circuit includes latches 100, 110, and 120, and delay elements 150 and 200. The circuit further includes a monostable circuit 250, a phase comparator 300, an operational amplifier 350, and load matching circuits consisting of transistors 901-906. The circuit finally includes a false lock detect circuit 500, a TTL level converter 550, a clock divider circuit 600, a multiplexer 650, a fast clock generator 700, and inverters 910-918.

FIGS. 2-14 show schematic and block diagrams of the circuitry residing within the respective circuit blocks of FIG. 1. This internal circuitry will first be explained in conjunction with the figures.

Figure 2:
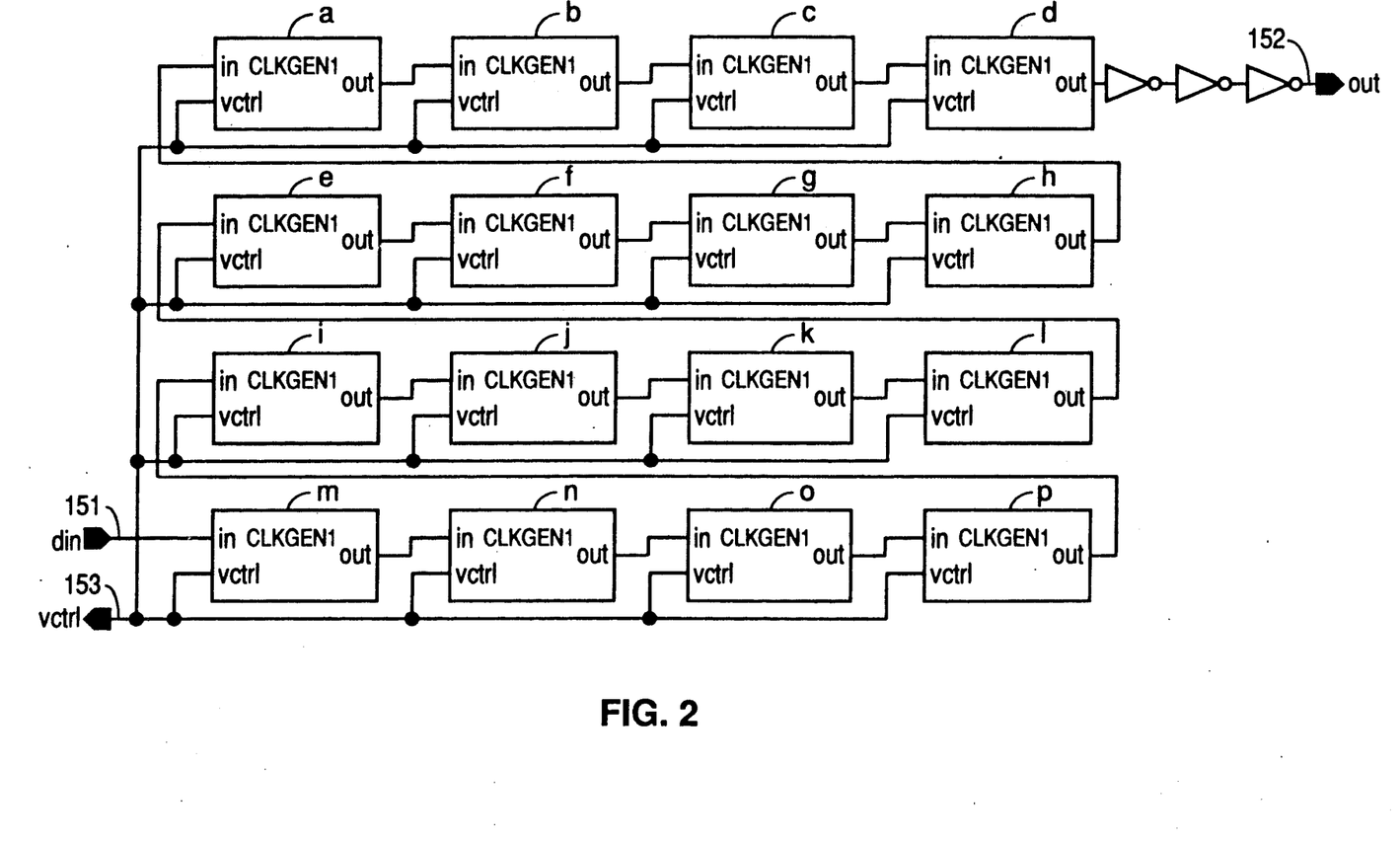
FIG. 2 is a block diagram of a delay circuit.

FIG. 2 shows a block diagram representative of each of the delay circuits 150 and 200. As shown, each of the delay circuits 150 and 200 include sixteen individual delay elements (a-p) interconnected in series. The circuit also includes inverters 198 and 199, an input line 151, a delayed output line 152, and a delay control line 153. As will be appreciated from the following description, as the voltage level at the delay control line 153 increases, the delay of the delay circuit (i.e., 150, 200) increases.

Figure 3:
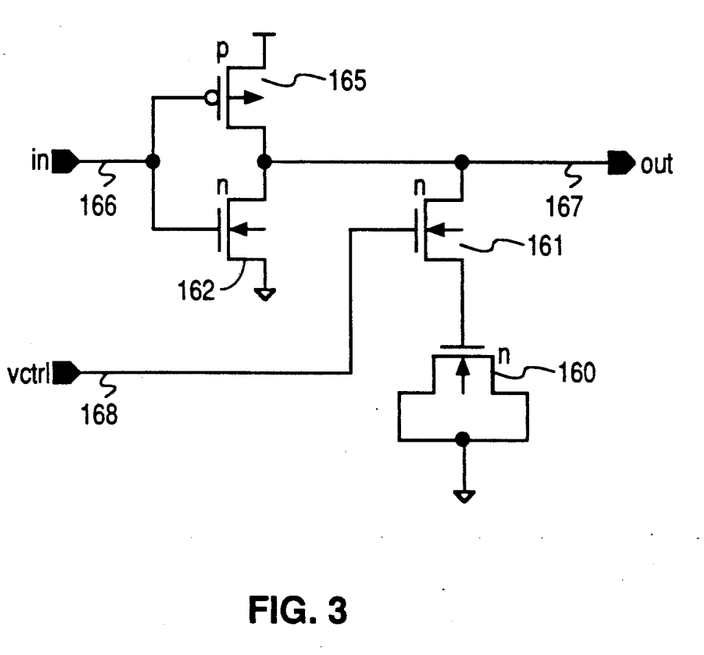
FIG. 3 is a schematic diagram of a single delay element within the delay circuit.

A schematic diagram of a single delay element representative of each of the delay elements (a-p) is shown in FIG. 3. The delay element includes N-channel field effect transistors 160-162 and a P-channel field effect transistor 165. The delay element further includes an input line 166, an output line 167, and a delay control line 168. As the voltage level at the delay control line 168 increases, N-channel field effect transistor 161 turns on increasingly stronger, thus causing a longer time delay (or time constant) characteristic for the circuit. It is noted that as a result of the topology of the delay element circuit, the time delay increases approximately linearly with respect to control voltage.

The series connection of delay elements a-p as shown in FIG. 2 results in an additive overall delay time. The particular number of delay elements included within the delay circuits 150 and 200 may vary depending upon various parameters of other blocks within the phase locked loop circuitry, as well as upon the delay time associated with each delay element. Variations may be made without departing from the spirit and scope of the invention.

Figure 4:
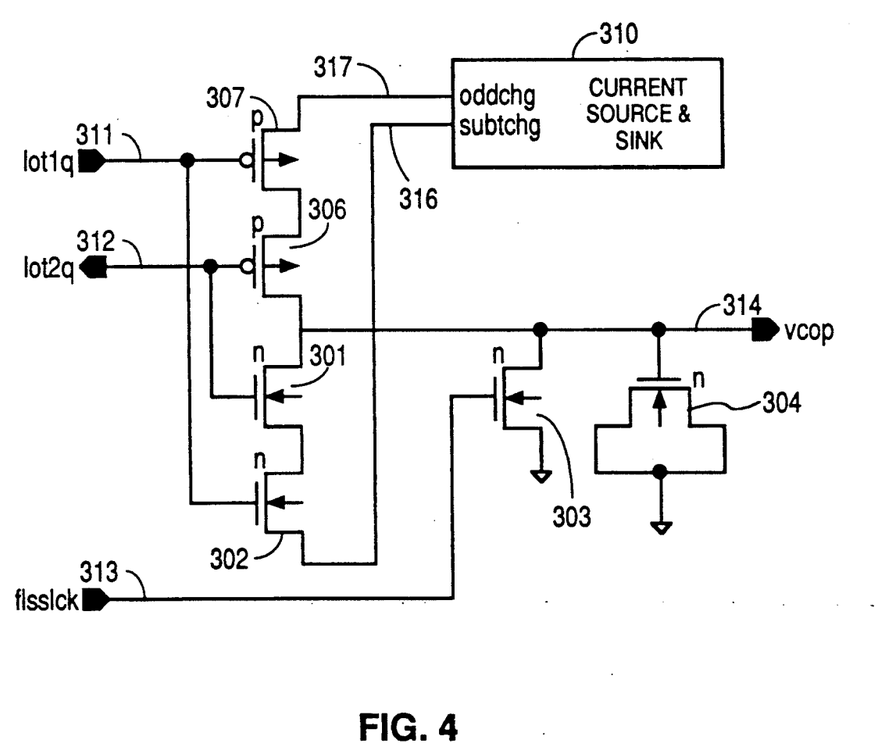
FIG. 4 is a schematic diagram of a phase comparator circuit.

Referring next to FIG. 4, a schematic diagram is shown of the phase comparator 300 that includes a precision matched current source and sink 310. The phase comparator 300 further comprises N-channel field effect transistors 301-304, and P-channel field effect transistors 306 and 307. The phase comparator 300 finally includes input lines 311 and 312, a line 313, and an output line 314. The precision matched current source and sink 310 includes an input line 316 and an output line 317 that draw and provide, respectively, an equal fixed current. If the voltage levels at input lines 311 and 312 are low, then transistors 306 and 307 are turned on, and a current flows from the output line 317 of the precision matched current source 310 that charges the capacitance across transistor 304. Accordingly, the voltage at output line 314 increases. Similarly, if the voltage levels at input lines 311 and 312 are both high, transistors 301 and 302 turn o and a current is drawn at the input line 316 of precision matched current source 310. Accordingly, the capacitance across transistor 304 discharges and the voltage level at output line 314 decreases. If the voltage levels at input lines 311 and 312 are different, the voltage level at the output line 314 does not change.

Figure 5:
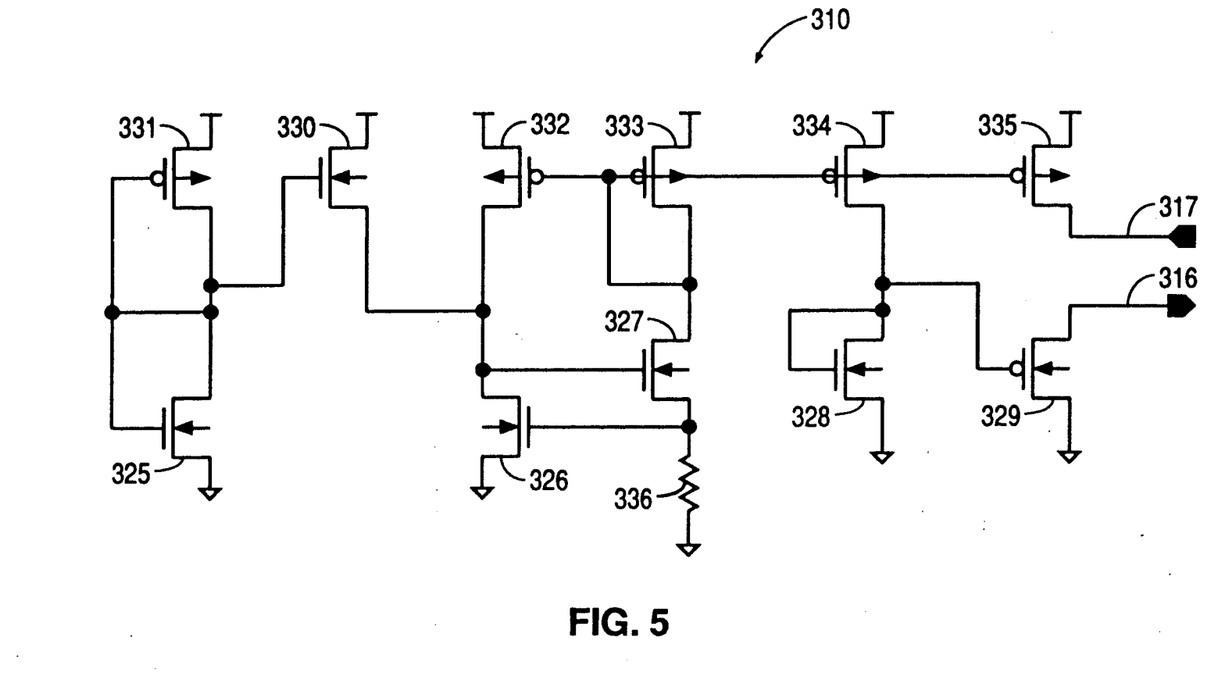
FIG. 5 is a schematic diagram of a precision matched current source and sink.

FIG. 5 is a schematic diagram of the precision matched current source and sink 310. The circuit includes N-channel field effect transistors 325-330, P-channel field effect transistors 331-335, and resistor 336. It is noted that the circuit is configured and fabricated such that the current level provided from line 317 is equal to the current level drawn in at line 316.

Figure 6:
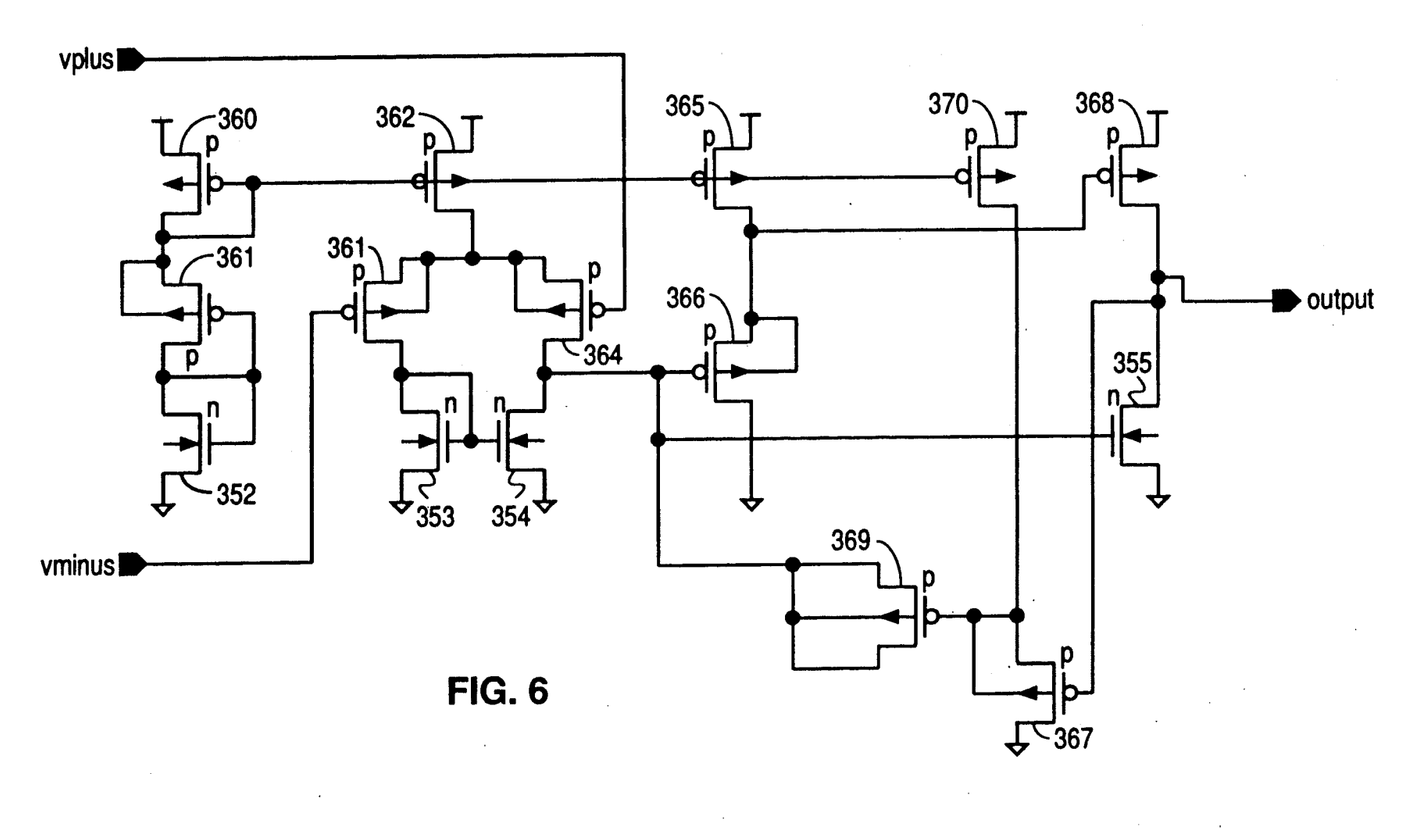
FIG. 6 is a schematic diagram of an operational amplifier.

FIG. 6 shows a schematic diagram of the operational amplifier 350. The operational amplifier 350 includes N-channel field effect transistors 352-355 and P-channel field effect transistors 360-370. It is noted that transistor 367 is connected in a source follower configuration to prevent zero feedthrough.

Figure 7:
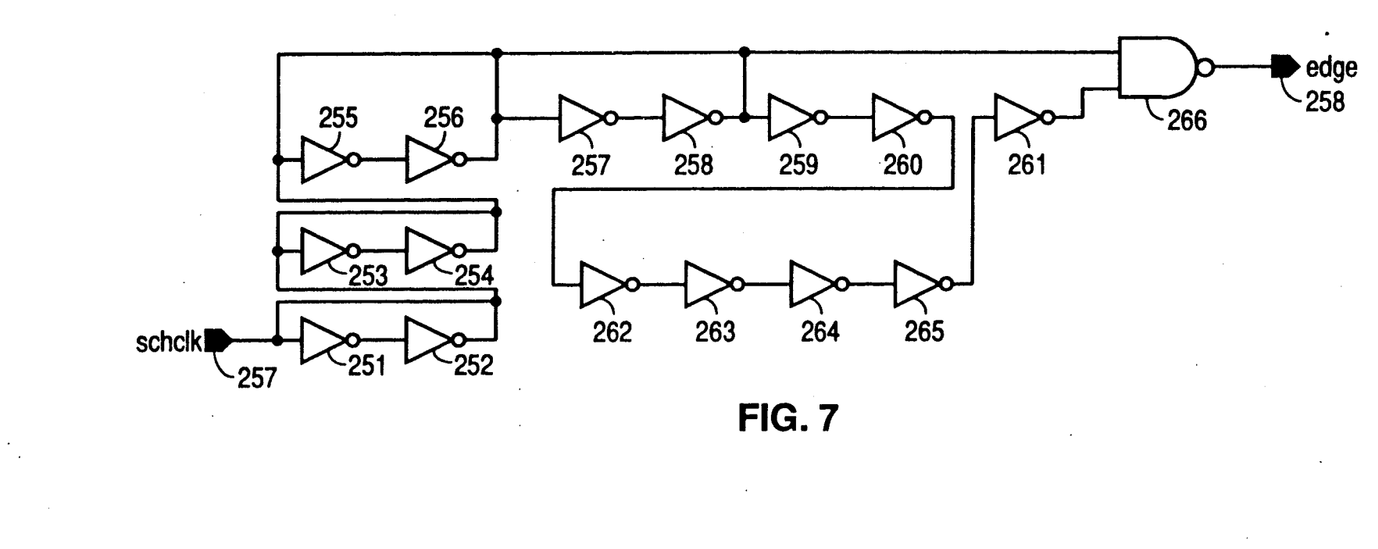
FIG. 7 is a schematic diagram of a monostable circuit.

FIG. 7 shows a schematic diagram of monostable circuit 250. Monostable circuit 250 includes inverters 251-265, and a NAND gate 266. As is evident from the schematic, when a clock signal at input line 257 goes low, the inputs to NAND gate 256 are momentarily high, and thus a low pulse is provided at the output line 258.

Figure 8:
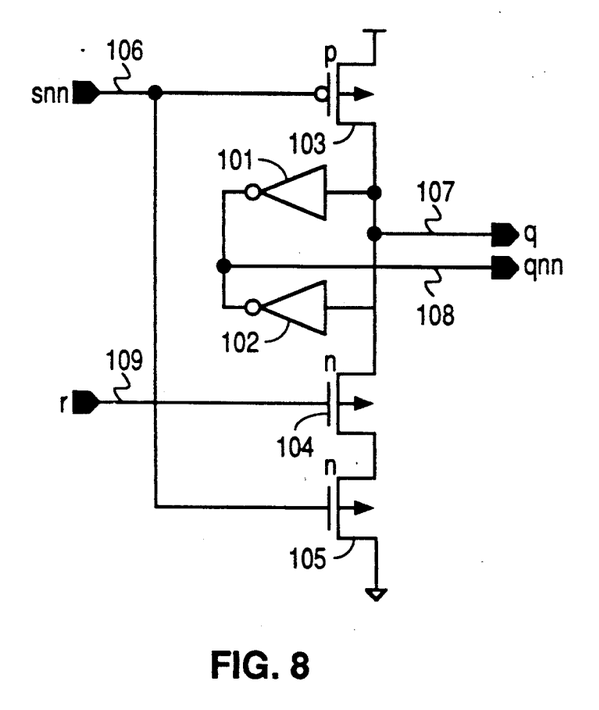
FIG. 8 is a schematic diagram of a latch circuit.

FIG. 8 shows a schematic diagram of a latch circuit representative of each of the latches 100, 110 and 120. The latch circuit includes inverters 101 and 102, P-channel field effect transistor 103, and N-channel field effect transistors 104 and 105. The latch circuit further includes an input line 106, an output line 107, an inverted output line 108, and a reset line 109. As is evident from the configuration of this latch circuit, when the voltage level at input line 106 goes low, the output line 107 goes high and input line 109 is gated out. When input line 106 goes high and input line 109 goes high, the output line 107 goes low.

Figure 9:
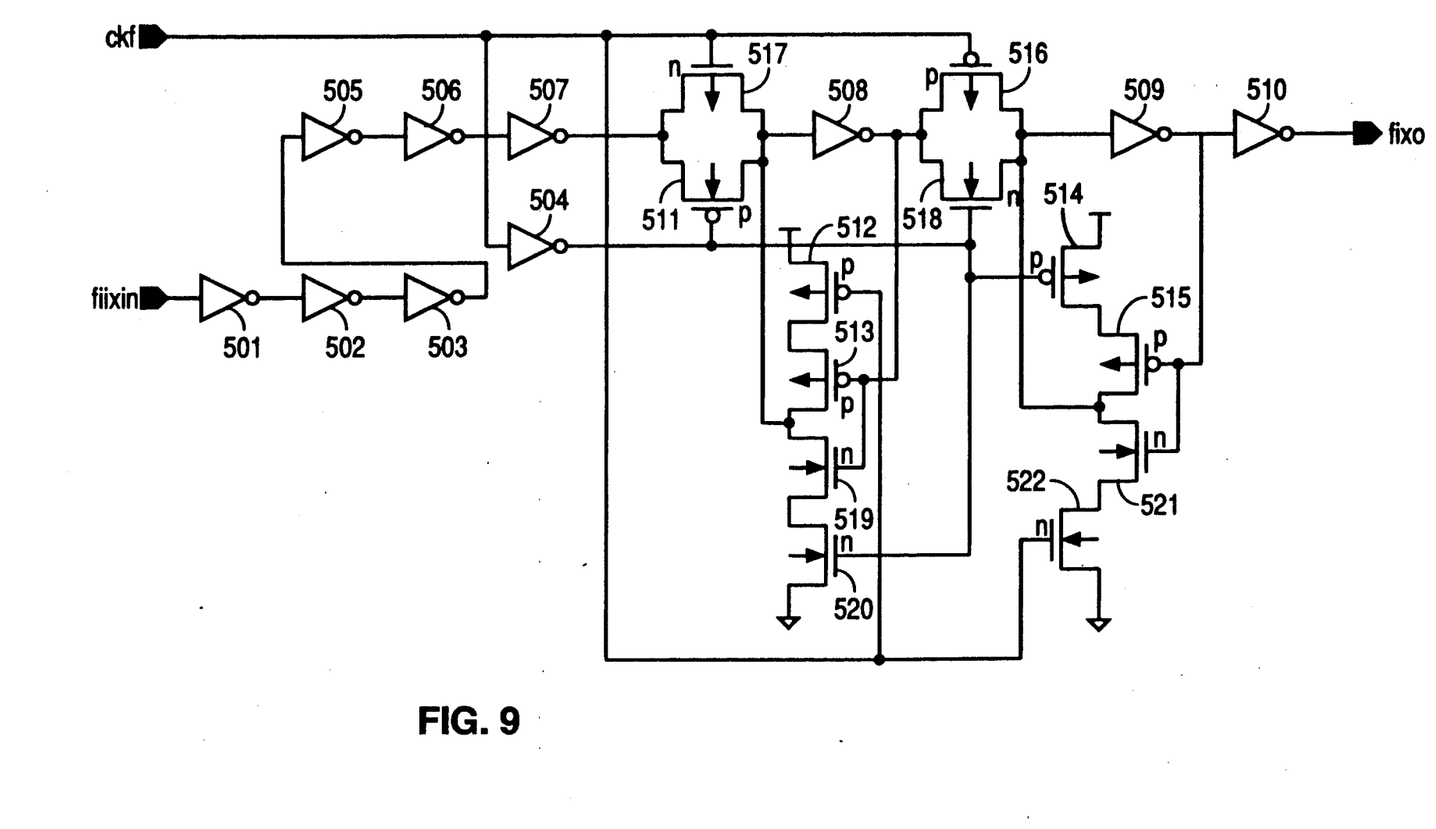
FIG. 9 is a schematic diagram of a false lock detect circuit.

FIG. 9 shows a circuit diagram of the false lock detect circuit 500. The false lock detect circuit 500 includes inverters 501-510, P-channel field effect transistors 511-516, and N-channel field effect transistors 517-522. The operation of the false lock detect circuit 500 will be better understood with reference to the description below.

Figure 10:
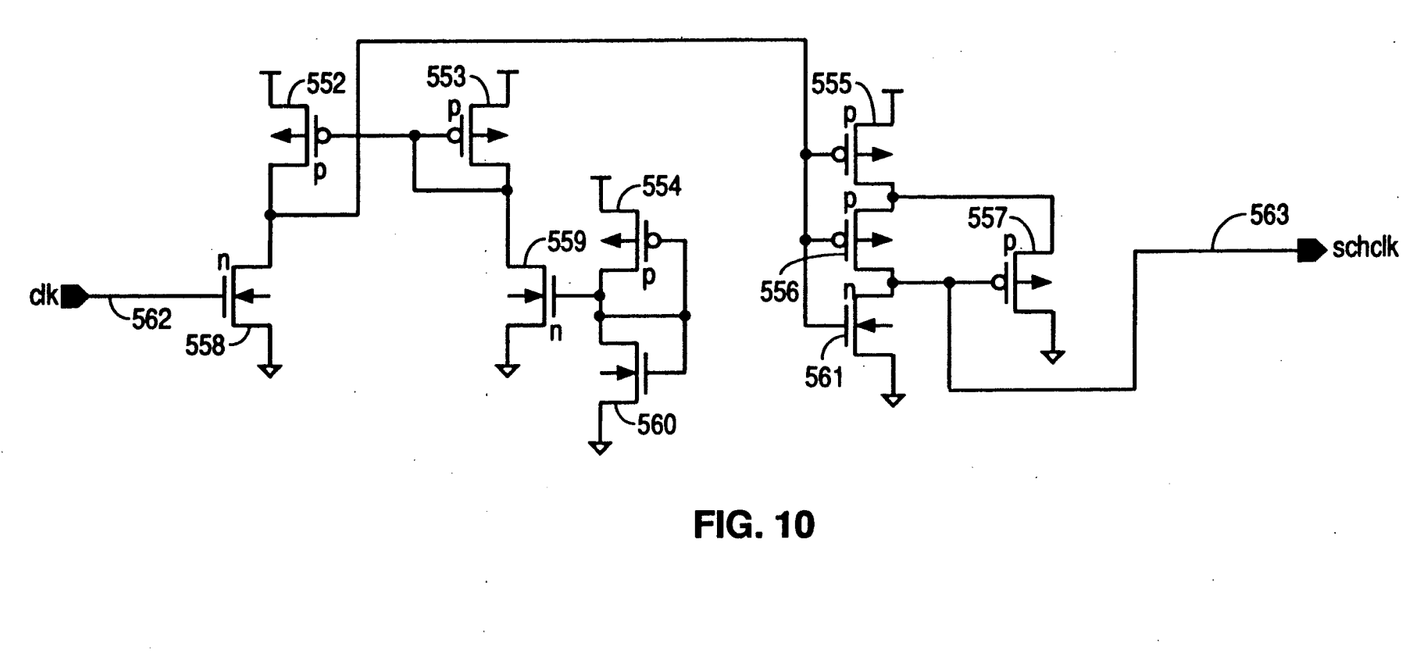
FIG. 10 is a schematic diagram of a TTL level converter.

FIG. 10 shows a block diagram of TTL level converter 550. The converter circuit includes P-channel field effect transistors 552-557, and N- channel field effect transistors 558-561. As is evident from the circuit of FIG. 10, a TTL logic signal at an input line 562 is converted to a CMOS signal ranging from 0-5 volts on an output line 563.

Figure 11:
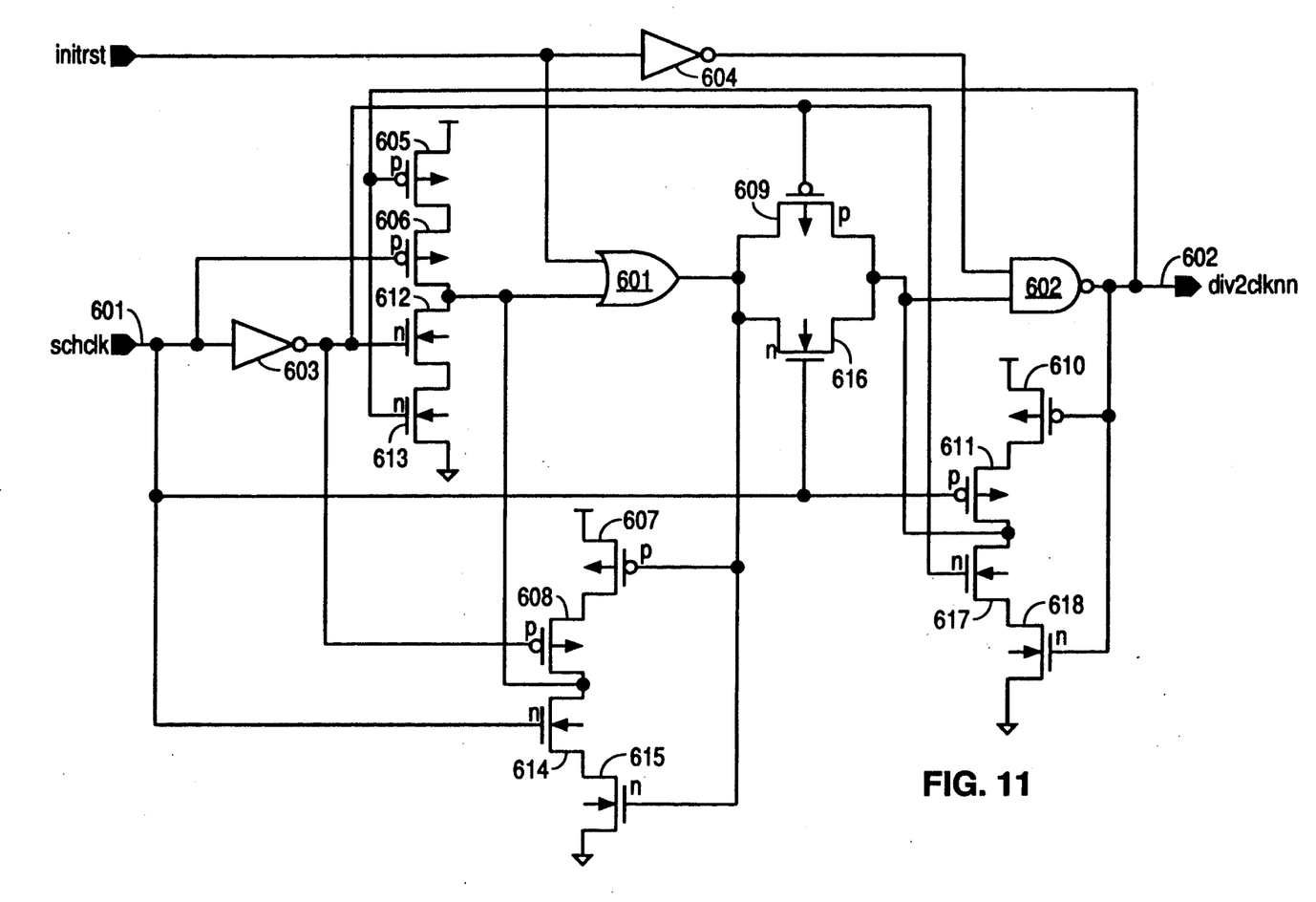
FIG. 11 is a schematic diagram of a clock divider circuit.

FIG. 11 shows a schematic diagram of clock divider circuit 600. The clock divider circuit 600 includes NOR gate 601, NAND gate 602, inverters 603 and 604, P-channel effect transistors 605-611, and a N-channel field effect transistors 612-618. It is noted that a signal is generated by the clock divider circuit 600 at the output line 602 that has a frequency half that of the frequency of the clock signal at input line 601.

Figure 12:
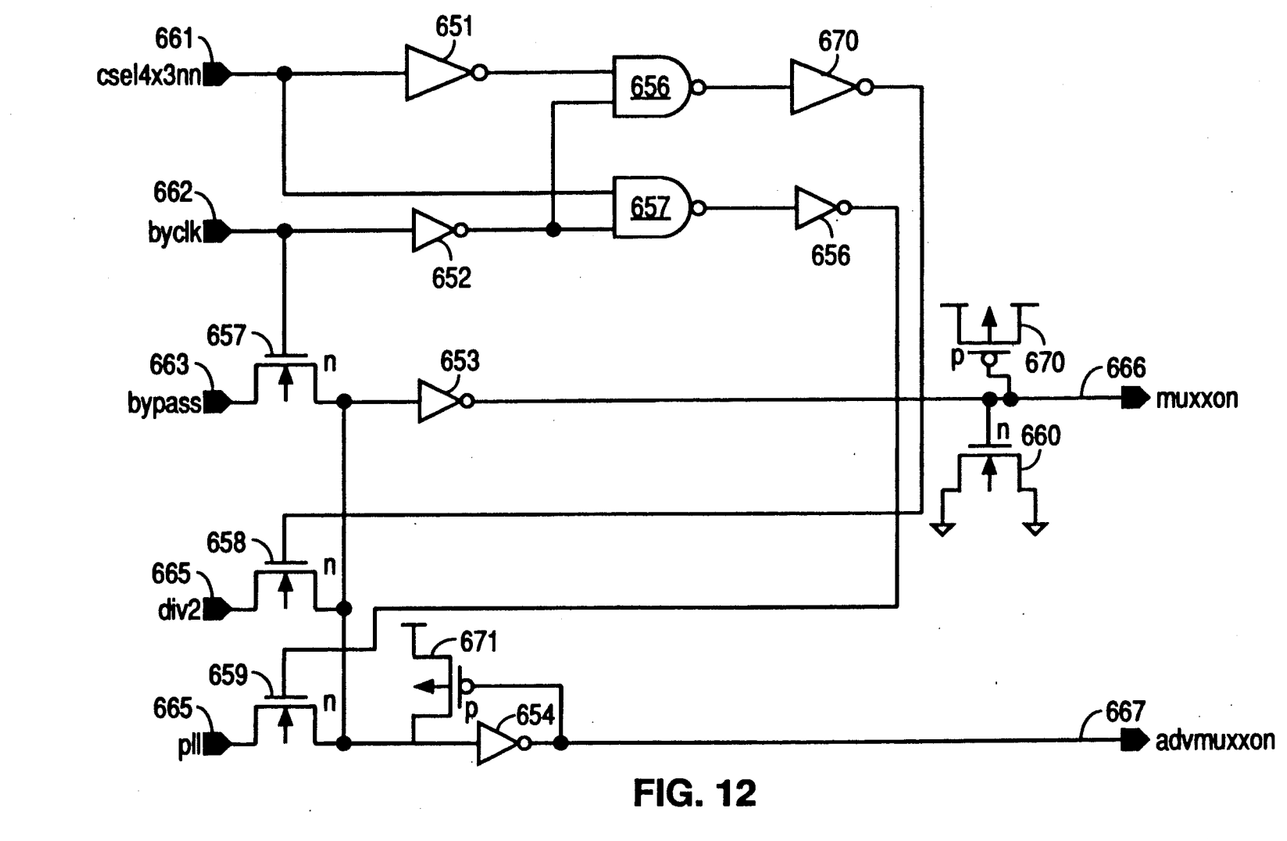
FIG. 12 is a schematic diagram of a multiplexer.

FIG. 12 shows a schematic diagram of multiplexer 650. Multiplexer 650 includes NAND gates 656 and 657, inverters 651-656, N-channel field effect transistors 657-660, and P-channel field effect transistors 670 and 671. Depending upon select input signals at select lines 661 and 662, the multiplexer provides an output signal at output line 666 from either input line 663, input line 664, or input line 665. The purpose of these input lines will be evident from the following.

Figure 13:
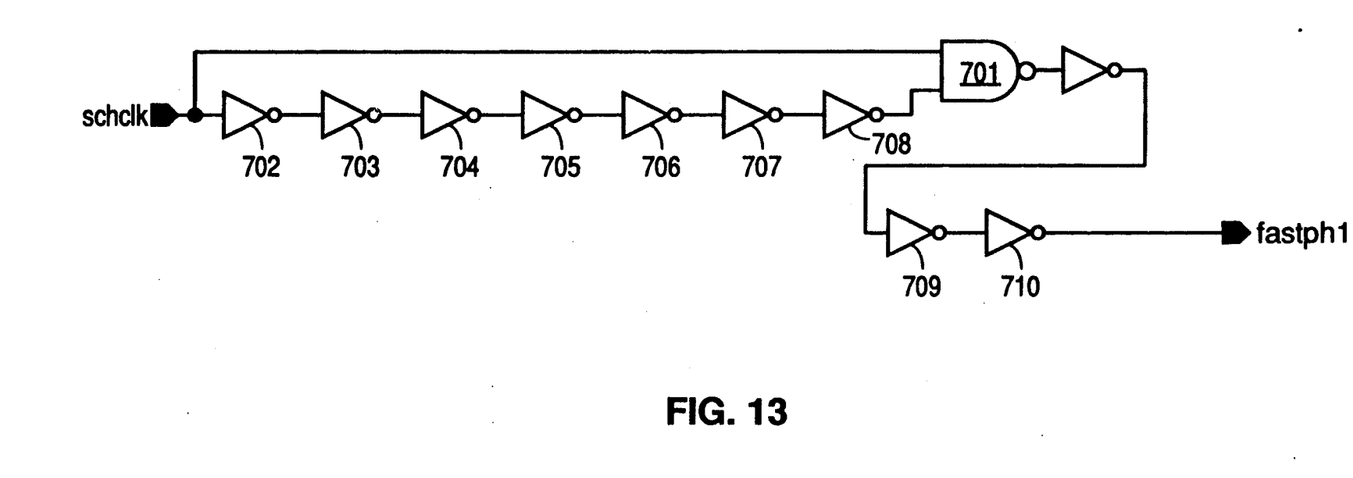
FIG. 13 is a schematic diagram of a fast clock generator.

FIG. 13 shows a schematic diagram of the fast clock generator 700. The fast clock generator 700 includes NAND gate 701 and inverters 702-710. The operation of the fast clock generator 700 is similar to that of the monostable circuit 250 described above.

Referring back to FIG. 1, the operation of the phase locked loop circuit is next described. Monostable circuit 250 detects the rising edge of the clock signal at input line 257. Upon the detection of a rising edge of the clock, the output line 258 of monostable circuit 250 goes low momentarily. In response, latch circuits 100 and 110 are set.

It is noted that during normal operation of the phase locked loop circuit, multiplexer 650 is selected by signals at the select lines 661 and 662 such that the input line 665 is coupled to the output line 666. Input lines 663 and 664 provide signals to output line 666 when the phase locked loop mode is not selected. Therefore, when the phase locked loop mode is selected, output line 666 goes high when latch 100 is set.

When latch 110 is set, the output signal from latch 110 is received at the trigger input of delay circuit 150. Following a time delay which is determined by the voltage level at the VCTRL line of delay circuit 160, the output of delay circuit 150 goes high. When the output of delay circuit 150 goes high, latches 100 and 110 are reset. Therefore, the output clock signal at output line 666 of multiplexer 650 goes low. The time period during which the output line of latch 100 is high thus defines the high time for the phase locked clock output signal.

At the same initial time when the output line of delay circuit 150 is low, the output of latch 120 is also low. When the output of delay circuit 150 goes high, latch 120 is set and thus the delay circuit 200 is triggered. Following a delay time as determined by the voltage level at the VCTRL line of delay circuit 200, the output line of delay circuit 200 goes high, thus causing latch 120 to reset. The time period during which the output line of latch 120 is high defines the low time of the phase locked signal as output line 666. Subsequent cycles are thereafter generated in response to subsequent rising edges of the clock signal at input line 257.

It is noted that if the high time of the clock signal at output line 666 is less than the low time, then the delay of delay circuits 150 and 200 are too short and the output signals of latches 110 and 120 are both low during an overlap period. In response, the voltage across transistor 304 of phase comparator 300 (FIG. 4) is charged by current flowing from precision matched current source and sink 310. Thus, the delay of delay circuits 150 and 200 is increased.

Similarly, if the delays are too long, the output signals of latches 110 and 120 are both high during an overlap period. In response, the voltage across transistor 304 is discharged by current flowing into the precision matched current source and sink 300. Thus, the delay of delay circuits 150 and 200 is decreased.

The false lock detect circuit 500 prevents false locking of the phase locked loop circuit to subharmonic frequencies. An inverted output signal from latch 110 is provided to the false lock detect circuit 500 at the line labeled fixin. In addition,, the edge pulse from output line 258 is provided to the input line labeled cfk. If the clock edge signal is asserted at line cfk while the signal at line fixin is high, then the phase locked loop circuit may possibly be locked to a lower frequency harmonic. The output line fix of the false lock detect circuit 500 in response goes high. When the output line goes high, transistor 303 of phase comparator 300 turns on, and the voltage across transistor 304 goes to zero. The delay of delay circuits 150 and 200 accordingly is decreased, and the frequency of the phase locked loop circuit is increased to its maximum level and is thereafter adjusted to lock to the correct input frequency.

It is noted that the phase locked loop circuit in accordance with the present invention cannot lock to superharmonic frequencies as a result of the programmable delay line configuration.

Numerous modifications and variations will become apparent to those skilled in the art once the above disclosure is fully appreciated. It is to be understood that the above detailed description of the preferred embodiment is intended to be merely illustrative of the spirit and scope of the invention and should not be taken in a limiting sense. The scope of the claimed invention is better defined with reference to the following claims.

I claim:

1. A phase locked loop circuit for providing a phase-stabilized output signal, said phase locked loop circuit comprising:

a first latch circuit having an output terminal that provides a first trigger signal having a first state and a second state, wherein said first trigger signal makes a transition from said first state to said second state in response to a transition of an input signal provided to said phase locked loop circuit;

a first variable delay circuit having a control terminal that receives a feedback signal to control the delay of said first variable delay circuit, said first variable delay circuit having an input terminal coupled to the output terminal of said first latch circuit and providing a first delay signal that is delayed with respect to said first trigger signal, wherein said first delay signal is provided to said first latch circuit to cause the first trigger signal to make a transition back to said first state from said second state;

a second latch circuit coupled to an output terminal of said first delay circuit for providing a second trigger signal having a first state and a second state wherein the second trigger signal makes a transition from said first state to said second state in response to a transition of said first delay signal;

a second variable delay circuit having a control terminal that receives said feedback signal to control the delay of said second variable delay circuit, said second variable delay circuit having an input terminal coupled to an output terminal of said second latch circuit and providing a second delay signal that is delayed with respect to said second trigger signal, wherein said second delay signal is provided to said second latch circuit to cause the second trigger signal to make a transition back to said first state from said second state;

a phase comparator coupled to the output terminal of said first latch circuit and to the output terminal of said second latch circuit for generating said feedback signal, wherein said feedback signal causes the delays of said first and said second variable delay circuits to change if a transition of said first trigger signal is not coincident with a transition of said second trigger signal; and an operational amplifier circuit coupled to an output terminal of said phase comparator and to the control terminals of said first and said second variable delay circuits, wherein said feedback signal is provided to said first and said second variable delay circuits through said operational amplifier.

2. The phase locked loop circuit as recited in claim 1 further comprising a false lock detect circuit coupled to said phase comparator and to said first latch circuit for detecting whether the phase locked loop circuit is locked to a sub-harmonic frequency.

3. The phase locked loop circuit as recited in claim 2 wherein said false lock detect circuit is further coupled to said first delay circuit and causes a delay time of said first delay circuit to decrease.

4. The phase locked loop circuit as recited in claim 1 wherein said first and said second variable delay circuits each include a plurality of delay elements each having a variable delay.

5. A phase locked loop circuit for providing a phase-stabilized output signal, said phase locked loop circuit comprising:

a first latch circuit having an output terminal that provides a first trigger signal having a first state and a second state, wherein said first trigger signal makes a transition from said first state to said second state in response to a transition of an input signal provided to said phase locked loop circuit;

a first variable delay circuit having a control terminal that receives a feedback signal to control the delay of said first variable delay circuit, said first variable delay circuit having an input terminal coupled to the output terminal of said first latch circuit and providing a first delay signal that is delayed with respect to said first trigger signal, wherein said first delay signal is provided to said first latch circuit to cause the first trigger signal to make a transition back to said first state from said second state;

a second latch circuit coupled to an output terminal of said first delay circuit for providing a second trigger signal having a first state and a second state wherein the second trigger signal makes a transition from said first state to said second state in response to a transition of said first delay signal;

a second variable delay circuit having a control terminal that receives said feedback signal to control the delay of said second variable delay circuit, said second variable delay circuit having an input terminal coupled to an output terminal of said second latch circuit and providing a second delay signal that is delayed with respect to said second trigger signal, wherein said second delay signal is provided to said second latch circuit to cause the second trigger signal to make a transition back to said first state from said second state;

a phase comparator coupled to the output terminal of said first latch circuit and to the output terminal of said latch circuit for generating said feedback signal, wherein said feedback signal causes the delays of said first and said second variable delay circuits to change if a transition of said first trigger signal is not coincident with a transition of said second trigger signal, wherein said feedback signal is provided to said first and said second variable delay circuits; and a false lock detect circuit coupled to said phase comparator and to said first latch circuit for detecting whether the phase locked loop circuit is locked to a subharmonic frequency.

6. The phase locked loop circuit as recited in claim 4 wherein said false lock detect circuit is further coupled to said first delay circuit and causes a delay time of said first delay circuit to decrease.

7. The phase locked loop circuit as recited in claim 5 wherein said first and said second variable delay circuits each include a plurality of delay elements each having a variable delay.

8. A phase locked loop circuit for providing a phase-stabilized output signal, said phase locked loop circuit comprising:

a first latch circuit having an output terminal that provides a first trigger signal having a first state and a second state, wherein said first trigger signal makes a transition from said first state to said second state in response to a transition of an input signal provided to said phase locked loop circuit;

a first variable delay circuit having a control terminal that receives a feedback signal to control the delay of said first variable delay circuit, said first variable delay circuit having an input terminal coupled to the output terminal of said first latch circuit and providing a first delay signal that is delayed with respect to said first trigger signal, wherein said first delay signal is provided to said first latch circuit to cause the first trigger signal to make a transition back to said first state from said second state;

a second latch circuit coupled to an output terminal of said first delay circuit for providing a second trigger signal having a first state and a second state wherein the second trigger signal makes a transition from said first state to said second state in response to a transition of said first delay signal;

a second variable delay circuit having a control terminal that receives said feedback signal to control the delay of said second variable delay circuit, said second variable delay circuit having an input terminal coupled to an output terminal of said second latch circuit and providing a second delay signal that is delayed with respect to said second trigger signal, wherein said second delay signal is provided to said second latch circuit to cause the second trigger signal to make a transition back to said first state from said second state;

a phase comparator coupled to the output terminal of said first latch circuit and to the output terminal of said latch circuit for generating said feedback signal, wherein said feedback signal causes the delays of said first and said second variable delay circuits to change if a transition of said first trigger signal is not coincident with a transition of said second trigger signal, wherein said feedback signal is provided to said first and to said second variable delay circuits;

wherein said first and said second variable delay circuits each include a plurality of delay elements each having a variable delay.

* * * * *